(12) United States Patent
Yang et al.

(10) Patent No.: US 7,872,288 B2
(45) Date of Patent: Jan. 18, 2011

(54) ORGANIC LIGHT-EMITTING DISPLAY DEVICE

(75) Inventors: Sun A Yang, Suwon-si (KR); Youn Chul Oh, Suwon-si (KR); Eun Jung Lee, Suwon-si (KR); Won Seok Kang, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 985 days.

(21) Appl. No.: 11/715,380

(22) Filed: Mar. 8, 2007

(65) Prior Publication Data
US 2007/0285942 A1 Dec. 13, 2007

(30) Foreign Application Priority Data
Jun. 9, 2006 (KR) .................. 10-2006-0052158

(51) Int. Cl.
 *H01L 31/062* (2006.01)
(52) U.S. Cl. .................. 257/292; 257/40; 257/82; 257/E33.076
(58) Field of Classification Search .................. 257/59, 257/72, 80–83, 40, 290–293, E33.076
See application file for complete search history.

(56) References Cited

U.S. PATENT DOCUMENTS

| | | | |
|---|---|---|---|
| 6,380,531 B1 | 4/2002 | Sugihwo et al. | |
| 6,933,532 B2* | 8/2005 | Arnold et al. | 257/80 |
| 7,397,065 B2* | 7/2008 | Tseng et al. | 257/72 |
| 7,622,785 B2* | 11/2009 | Sasagawa et al. | 257/432 |
| 2002/0044208 A1 | 4/2002 | Yamazaki et al. | |
| 2005/0056841 A1 | 3/2005 | Yamazaki et al. | |
| 2005/0199876 A1 | 9/2005 | Matsumoto | |
| 2005/0258462 A1 | 11/2005 | Min | |
| 2006/0012311 A1 | 1/2006 | Ogawa | |
| 2006/0030084 A1* | 2/2006 | Young | 438/149 |
| 2006/0164408 A1 | 7/2006 | Nishikawa et al. | |
| 2007/0093007 A1* | 4/2007 | Deane | 438/154 |

FOREIGN PATENT DOCUMENTS

| | | |
|---|---|---|
| EP | 1 139 454 | 10/2004 |
| JP | 2000-031451 | 1/2000 |
| JP | 2002-280596 | 9/2002 |

(Continued)

OTHER PUBLICATIONS

Zimmermann, H.; Muller, B.; Hammer, A.; Herzog, K.; Seegebrecht, P.; "Large-area lateral p-i-n photodiode on SOI," Electron Devices, IEEE Transactions on , vol. 49, No. 2, pp. 334-336, Feb 2002.*

*Primary Examiner*—Wael M Fahmy
*Assistant Examiner*—Mark W Tornow
(74) *Attorney, Agent, or Firm*—Lee & Morse, P.C.

(57) ABSTRACT

An organic light-emitting display device includes a substrate, a first buffer layer and a second buffer layer on the substrate, a thin film transistor on the second buffer layer, an organic light-emitting diode electrically connected with the thin film transistor, and a photo sensor with an intrinsic region on the second buffer layer, wherein the photo sensor is capable of absorbing red light from the organic light-emitting diode and of exhibiting quantum efficiency of from about 50% to about 90%.

18 Claims, 8 Drawing Sheets

FOREIGN PATENT DOCUMENTS

| | | |
|---|---|---|
| JP | 2006-030318 | 2/2006 |
| KR | 1992-0013791 | 7/1992 |
| KR | 10-1999-0006168 | 1/1999 |
| KR | 10-2005-0108903 | 11/2005 |
| KR | 10-2006-0041707 A | 5/2006 |
| KR | 10-2006-0050070 A | 5/2006 |
| WO | WO 2004/109641 | * 12/2004 |

* cited by examiner

ORGANIC LIGHT-EMITTING DISPLAY DEVICE

BACKGROUND OF THE INVENTION

1. Field of the Invention

The present invention relates to organic light-emitting display devices. In particular, the present invention relates to an organic light-emitting display device with a photo sensor capable of controlling brightness thereof, while exhibiting an overall quantum efficiency of 50% to 90%.

2. Description of the Related Art

In general, an organic light-emitting display device is a flat display device where voltage may be applied to a plurality of layers interposed between two electrodes, i.e., an anode electrode and a cathode electrode, to combine electrons and holes to form images. In particular, the conventional organic light-emitting display device may include a hole injecting layer, a hole transporting layer, at least one organic light emitting layer, an electron injecting layer and an electron transporting layer between the electrodes. Accordingly, holes may be injected into the hole injecting layer from the anode electrode, so the injected holes may be transported to the organic light emitting layer through the hole transporting layer. Similarly, electrons may be injected into the electron injecting layer from the cathode electrode, so the injected electrons may be transported to the organic light emitting layer through the electron transporting layer. The transported holes and the electrons may combine with one another in the organic light emitting layer to form excitons, and, thereby, emit visible light and form images.

The conventional organic light emitting layer of the organic light-emitting display device may deteriorate over time and, thereby, reduce brightness of light emitted therefrom and/or modify color coordinates thereof. Reduced brightness of light emitted from the organic light emitting layer may decrease the image quality of the organic light emitting display device and its overall lifespan. Attempts have been made to improve the brightness of the organic light-emitting display device by incorporating a photo sensor therein. However, the conventional photo sensor may have quantum efficiency below 50%, thereby providing a limited brightness enhancement to the organic light-emitting display device.

Accordingly, there exists a need for an organic light-emitting display device with a photo sensor capable of controlling brightness thereof, while exhibiting improved quantum efficiency.

SUMMARY OF THE INVENTION

The present invention is therefore directed to an organic-light emitting display device, which substantially overcomes one or more of the disadvantages of the related art.

It is therefore a feature of the present invention to provide an organic light-emitting display device having a photo sensor capable of controlling color brightness, while exhibiting enhanced quantum efficiency.

At least one of the above and other features and advantages of the present invention may be realized by providing an organic light-emitting display device, including a substrate, a first buffer layer and a second buffer layer on the substrate, a thin film transistor on the second buffer layer, an organic light-emitting diode electrically connected with the thin film transistor, and a photo sensor with an intrinsic region on the second buffer layer, wherein the photo sensor is capable of absorbing red light from the organic light-emitting diode and of exhibiting quantum efficiency of from about 50% to about 90%. The absorbed red light may have a wavelength of from about 645 nm to about 700 nm.

The first buffer layer may have a thickness of from about 2900 angstroms to about 3100 angstroms, the second buffer layer may have a thickness of from about 200 angstroms to about 400 angstroms, and the intrinsic region may have a width of from about 3 µm to about 10 µm. Alternatively, the first buffer layer may have a thickness of from about 700 angstroms to about 900 angstroms, the second buffer layer may have a thickness of from about 100 angstroms to about 300 angstroms, and the intrinsic region may have a width of from about 4 µm to about 10 µm. In yet another alternative, the first buffer layer may have a thickness of from about 700 angstroms to about 900 angstroms, the second buffer layer may have a thickness of from about 300 angstroms to about 500 angstroms, and the intrinsic region may have a width of from about 5 µm to about 10 µm.

The first buffer layer may include silicon oxide. The second buffer layer may include silicon nitride. The photo sensor may include amorphous silicon.

The intrinsic region of the photo sensor may be between a N-type doping region and a P-type doping region, wherein the intrinsic region, the N-type doping region and the P-type doping region may be on a same plane. The photo sensor may be capable of converting the absorbed red light into electrical signals. The electrical signals may be capable of controlling brightness of the light light-emitted from the organic light-emitting diode.

The organic light-emitting diode may be a rear-type organic light-emitting diode. The organic light-emitting display device may include a gate insulating layer disposed on the second buffer layer, wherein a portion of the gate insulating layer may be positioned between the thin film transistor and the photo sensor. The organic light-emitting display device may also include a transparent anode in the organic light-emitting diode. The organic light emitting display device may be incorporated into a portable electronic apparatus.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
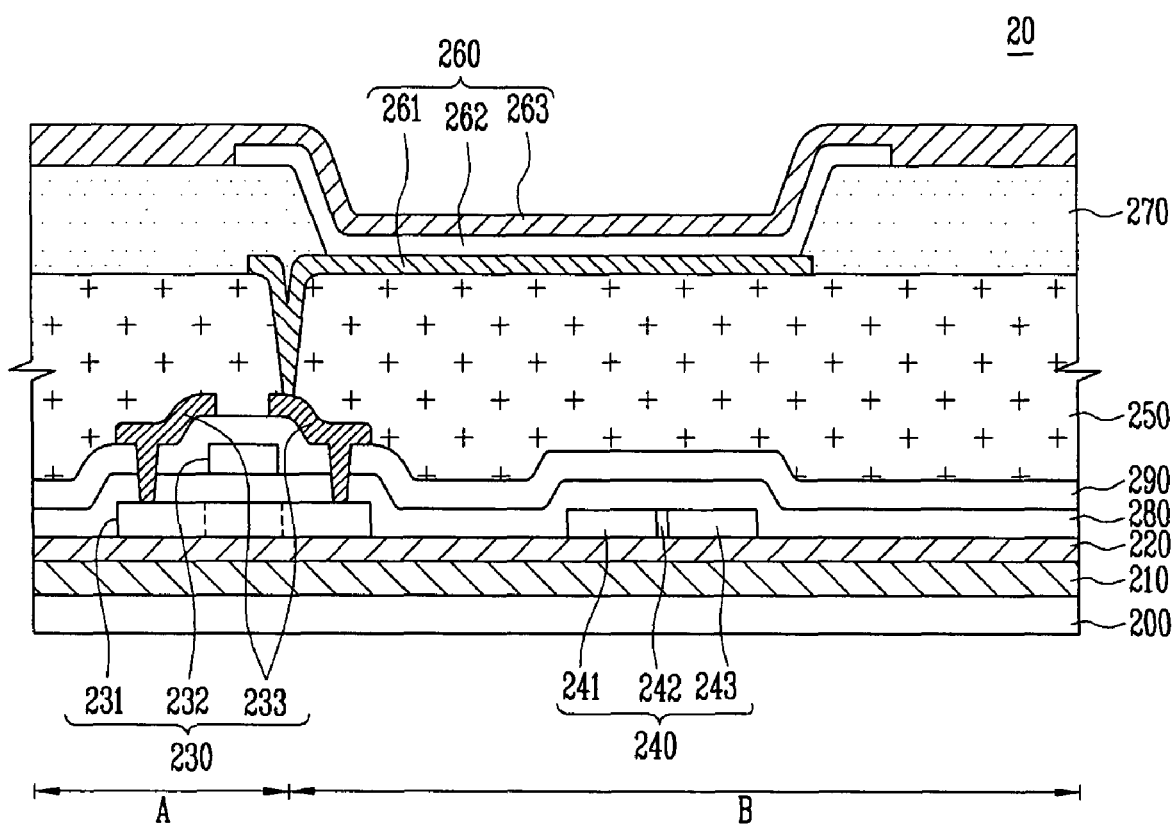
FIG. 1 illustrates a cross-sectional view of an organic light-emitting display device having a photo sensor according to an exemplary embodiment of the present invention.

Korean Patent Application No. 10-2006-0052158, filed on Jun. 9, 2006, in the Korean Intellectual Property Office, and entitled: "Organic Light-Emitting Display Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or an element is referred to as being "on" another layer, element or substrate, it can be directly on the other layer, element or substrate, or intervening layers or elements may also be present. Further, it will be understood that when a layer or an element is referred to as being "under" another layer or element, it can be directly under, or one or more intervening layers or elements may also be present. In addition, it will also be understood that when a layer or an element is referred to as being "between" two layers or elements, it can be the only layer or element between the two layers or elements, or one or more intervening layers or elements may also be present. Like reference numerals refer to like elements throughout.

Figure 2:
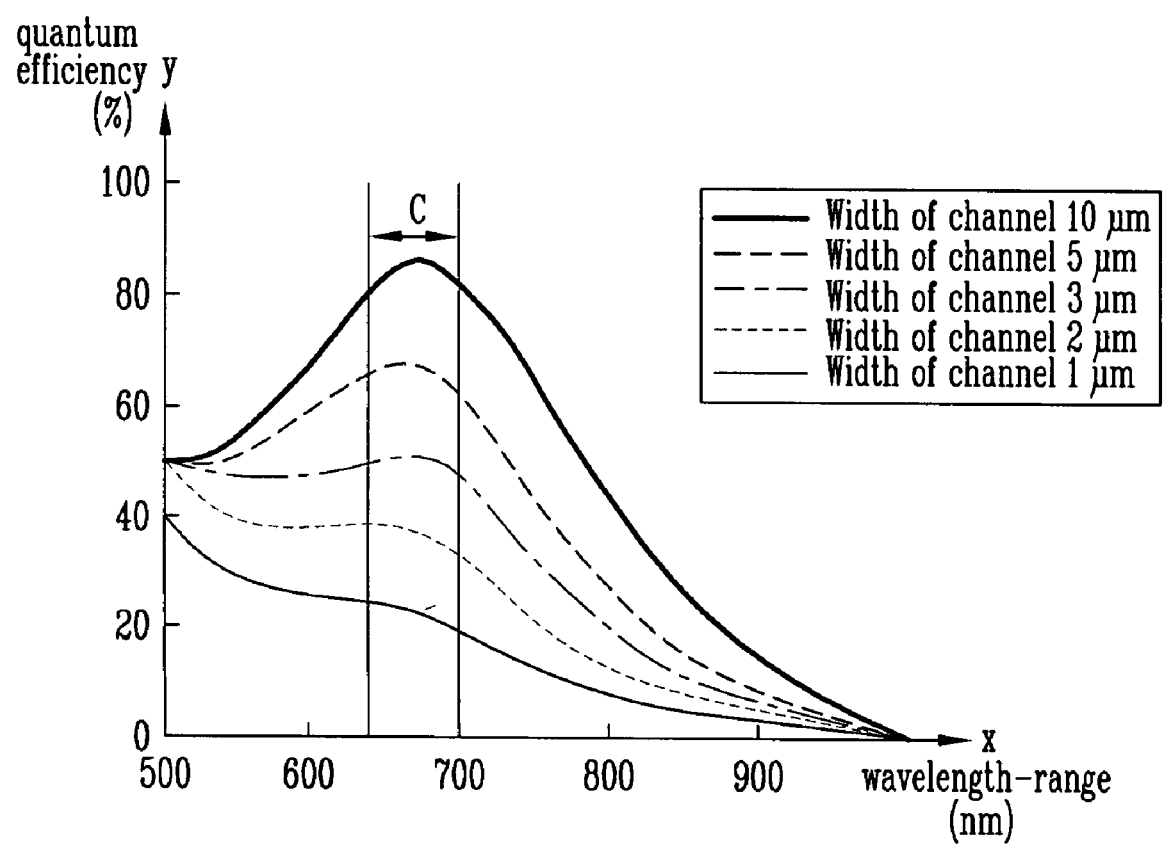
FIG. 2 illustrates a graph of quantum efficiency of the photo sensor illustrated in FIG. 1.

Hereinafter, an exemplary embodiment of an organic light-emitting display device according to the present invention will be described in more detail below with reference to FIG. 1. As illustrated in FIGS. 1-2, an organic light-emitting display device 20 according to an embodiment of the present invention may include a substrate 200, a first buffer layer 210 and a second buffer layer 220 on the substrate 200, a thin film transistor 230 on the second buffer layer 220, an organic light-emitting diode 260 electrically connected to the thin film transistor 230, and a photo sensor 240.

The substrate 200 of the organic light-emitting display device 20 may be made of any insulating material, e.g., glass, plastic, silicon, synthetic resin, and so forth, as determined by one of ordinary skill in the art. Preferably, the substrate 200 may be transparent, e.g., a glass substrate. Additionally, the substrate 200 may be formed to have a non-pixel region A and a pixel region B therein, as illustrated in FIG. 1, such that the pixel region B may include a region of the substrate 200 that is capable of displaying images, e.g., an area including the organic light emitting diode 260, and the non-pixel region A may include all the regions of the substrate 200 that are not capable of displaying images, i.e., regions other than the pixel region B. For example, the thin film transistor may be formed in the non-pixel region A.

The first buffer layer 210 of the organic light-emitting display device 20 may be made of silicon oxide ($SiO_2$) to a thickness of from about 2900 angstroms to about 3100 angstroms on the substrate 200. The second buffer layer 220 may be made by depositing silicon nitride ($SiNx$) on the first buffer layer 210 to a thickness of from about 200 angstroms to about 400 angstroms. Without intending to be bound by theory, it is believed that such thickness of the first buffer layer 210 and the second buffer layer 220 may be advantageous in the present invention to facilitate enhanced quantum efficiency of the photo sensor 240 as will be discussed in more detail below. It should further be noted that the first buffer layer 210 and the second buffer layer 220 according to the present invention may minimize diffusion of impurities into the thin film transistor 230 and the photo sensor 240 during post-processing thereof.

The thin film transistor 230 of the organic light-emitting display device 20 may be formed on the second buffer layer 220 by crystallizing an amorphous silicon layer into a low temperature polysilicon (LTPS) via, for example, laser irradiation. The thin film transistor 230 may include a semiconductor layer 231, a gate electrode 232, and a source/drain electrode 233, wherein a gate insulating layer 280 may be disposed between the semiconductor layer 231 and the gate electrode 232 and an inter-insulating layer 290 may be disposed between the gate electrode 232 and the source/drain electrode 233. The gate insulating layer 280 may be deposited on the second buffer layer 220 and over the semiconductor layer 231 and the photo sensor 240, as illustrated in FIG. 1, such that a portion of the gate insulating layer 280 may be positioned on the second buffer layer 220 between the semiconductor layer 231 of the thin film transistor 230 and the photo sensor 240 to separate therebetween. The source/drain electrode 233 of the thin film transistor 230 may be disposed over the inter-insulating layer 290 and electrically connected with both sides of the semiconductor layer 231 via a contact hole formed through the gate insulating layer 280 and the inter-insulating layer 290.

The organic light-emitting diode 260 of the light-emitting display device 20 may be formed on the substrate 200 and include a first electrode layer 261, a second electrode layer 263, and a light emitting layer 262 therebetween. The organic light-emitting diode 260 may be electrically connected to the thin film transistor 230, i.e., any one of the source and drain electrodes 233, via a hole.

The first electrode layer 261 of the organic light-emitting diode 260 may be made of any suitable transparent conductor, e.g., indium-tin-oxide (ITO), indium-zinc-oxide (IZO), zinc oxide (ZnO), and so forth. The second electrode layer 263 of the organic light-emitting diode 260 may be formed on the first electrode layer 261. At least one layer of the second electrode layer 263 may be made of a reflective metal film. The light emitting layer 262 of the organic light-emitting diode 260 may be formed between the first and second electrode layers 261 and 263, respectively. In particular, the light emitting layer 262 may be formed to partially expose the first electrode layer 261. Further, the light emitting layer 262 may include a hole injecting layer, a hole transporting layer, an electron transporting layer and an electron injecting layer. Accordingly, the light emitting layer 262 may generate light when holes and electron injected from the first and second electrode layers 261 and 263, respectively, are coupled therein. Further, the light emitted from the light emitting layer 262 may be emitted to the substrate 200 through the first electrode layer 261 due to the reflective metal film employed in the second electrode layer 263.

The photo sensor 240 of the light-emitting display device 20 may be any suitable optical sensor capable of receiving a light signal and converting the light signal into an electrical signal, e.g., current or voltage. For example, the photo sensor 240 may be a semiconductor device having a light detecting function, such as a diode with a light detecting function at a junction thereof, i.e., a photo diode. In other words, because electrons or holes may be generated by means of absorption of photons, and, therefore, a conductivity of a diode may be modulated with respect to a light signal detected therein, a diode functioning as the photo sensor 240 may convert light signals into electrical signals with respect to changes of current flow therein as related to optical changes.

The photo sensor 240 may be formed on the second buffer layer 220. In particular, the photo sensor 240 may be formed of amorphous silicon in the pixel region B of the substrate 200, as illustrated in FIG. 1, and crystallized as polycrystalline silicon through a predetermined heat treatment, i.e., any appropriate heat treatment of amorphous silicon material as determined by a person skilled in the art. More specifically, the photo sensor 240 may be formed to be able to absorb light in a red wavelength-range, e.g., from about 645 nm to about 700 nm, emitted from the organic light-emitting diode 260. In other words, the photo sensor 240 may be positioned on the second buffer layer 220, such that vertical rays of light emitted from the organic light-emitting diode 260 may reach the photo sensor 240.

The photo sensor 240 may have a structure of a P-i(intrinsic)-N and, therefore, have a N-type doping region 241 for applying a positive voltage, a P-type doping region 243 for applying a negative voltage, and an intrinsic region 242 therebetween. The N-type doping region 241, the P-type doping region 243, and the intrinsic region 242 may be positioned on a same plane, e.g., positioned in direct communication with the second buffer layer 220. In particular, the N-type doping region 241 may be formed by injecting a high concentration of N-type impurity ions into a first region of the polycrystalline silicon, i.e., photo sensor 240. Similarly, the P-type doping region 243 may be formed by injecting a high concentration of P-type impurity ions into a second region of the polycrystalline silicon. In this respect, it should be noted that the first region of the polycrystalline silicon may be horizontally separated from the second region thereof, such that the intrinsic region 242 may be formed therebetween.

The intrinsic region 242 of the photo sensor 240 may be formed of polycrystalline silicon between the N-type doping region 241 and the P-type doping region 243, such that no impurities may be injected therein. The intrinsic region 242 may generate charges according to the incident light through its surface in order to convert the charges into electric energy. Without intending to be bound by theory, it is believed that the intrinsic region 242 of the photo sensor 240 may increase the thickness of a depletion layer thereof, thereby decreasing the capacity of the photo sensor 240. Such a decrease in the electrostatic capacity of the photo sensor 240 may increase the operation speed and decrease the power consumption thereof as compared to a conventional diode. Additionally, the photo sensor 240 may have a lower dark current, i.e., current flow when a photo sensor is not exposed to light, as compared to the conventional diode.

The intrinsic region 242 may be formed to have a width of from about 3 μm to about 10 μm. Such a width of the intrinsic region 242 may provide the photo sensor 240 with a quantum efficiency of from about 50% to about 90%. In particular and without intending to be bound by theory, it is believed that formation of the photo sensor 240 with an intrinsic region 242 having a width of about 3 μm to about 10 μm on the first and second buffer layers 210 and 220 having specific thicknesses as described above may be advantageous in improving the quantum efficiency of the photo sensor 240 due to improved pixel aperture ratio and reduced junction areas of the N-type and P-type doping regions 241 and 243. On the other hand, if the intrinsic region 242 is formed to have a width other than from about 3 μm to about 10 μm, the quantum efficiency of the red wavelength-range may be below about 50%, thereby reducing a capability of controlling the photo sensor 240 for the purpose of brightness enhancement.

For example, as illustrated in FIG. 2, a photo sensor formed on two buffer layers, i.e., a first buffer layer having a thickness of 3000 angstroms and a second buffer layer having a thickness of 300 angstroms, and having an intrinsic layer with a width of 3 μm, exhibits quantum efficiency of about 50%. Further, an increase in the width of the intrinsic region to 10 μm may provide quantum efficiency of over 80%. On the other hand, when the intrinsic region had a width below 3 μm, the quantum efficiency of the photo sensor is in the range of 20% to 40%.

In this respect, it should be noted that the X and Y axes of the graph illustrated in FIG. 2 refer to a wavelength-range and quantum efficiency of the photo sensor in the red wavelength range, respectively. "Quantum efficiency" refers to a rate at which red light incident from the organic light-emitting diode is absorbed by the photo sensor, while the actual quantum efficiency values are produced as a ratio between (1240× Current leaving the device in amperes) and (wavelength× power used in watts).

Accordingly, if an anode voltage is applied to the P-type doping region 243 and a cathode voltage is applied to the N-type doping region 241, the intrinsic region 242 may become fully depleted, thereby generating charges by absorbing light signals, from the organic light-emitting diode 260 and converting them into electrical signals. The electrical signals generated by the photo sensor 240 in response to the absorbed light signals may represent actual brightness values of the organic light-emitting diode 260 and be compared to a predetermined brightness reference value. Any deviation of the actual brightness values from the predetermined brightness reference value may be controlled by the photo sensor 240, thereby facilitating constant brightness output from the organic light-emitting diode 260, i.e., light generated by the light emitting layer 262.

More specifically, for example, electric signals generated by the photo sensor 240, i.e., signals representing actual brightness values, may be supplied to a signal processing part and, subsequently, to a gamma compensating part in order to perform a predetermined gamma revision and to generate a standard voltage corresponding to each gradation level. The standard voltage corresponding to each gradation level may be applied to a data signal generator to generate a data signal to be applied to respective data lines. Alternatively, electric signals generated by the photo sensor 240 may be supplied to a controller, so that the controller may output a respective control signal for controlling the brightness of the light emitting layer 262 with respect to the internal red light thereof.

The light-emitting display device 20 according to an embodiment of the present invention may also include a planarization layer 250. The planarization layer 250 may be formed on the thin film transistor 230 by depositing a layer of an oxide, e.g., silicon oxide ($SiO_2$) or a nitride, e.g., silicon nitride (SiNx). In particular, the planarization layer 250 may be positioned between the thin film transistor 230 and the organic light emitting diode 260, and a portion of the planarization layer 250 may be etched to expose one of the source and drain electrodes 233 in order to provide a connection between the thin film transistor 230 and the organic light emitting diode 260.

The light-emitting display device 20 according to an embodiment of the present invention may also include a pixel defining film 270. The pixel defining film 270 may be formed on the planarization layer 250, such that the pixel defining film 270 may include an opening part (not shown) to at least partially expose the first electrode layer 261 of the organic light emitting diode 260. In particular, portions of the pixel defining film 270 may be positioned between the first and second electrode layers 261 and 263 of the organic light emitting diode 260. The pixel defining film 270 may be made of an organic insulation material, e.g., acrylic organic compounds, polyamides, polyimides, and so forth.

Figure 3:
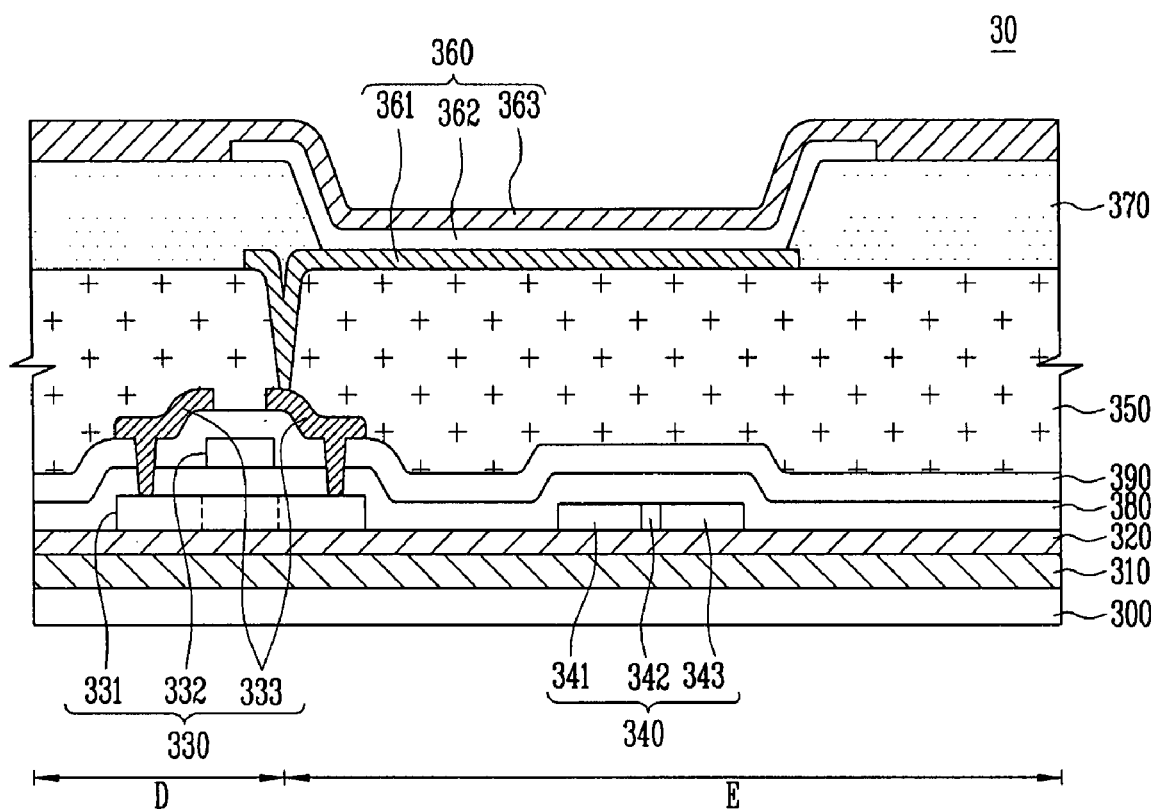
FIG. 3 illustrates a cross-sectional view of an organic light-emitting display device having a photo sensor according to another exemplary embodiment of the present invention.

In another exemplary embodiment of the present invention, illustrated in FIG. 3, an organic light-emitting display device 30 may include a substrate 300 having a non-pixel region D and a pixel region E, a first buffer layer 310 and a second buffer layer 320 on the substrate 300, a thin film transistor 330 on the second buffer layer 320, an organic light-emitting diode 360 electrically connected to the thin film transistor 330, and a photo sensor 340. The structures of the substrate 300, the thin film transistor 330, and the organic light-emitting diode 360 may be similar to the structures of the substrate 200, the thin film transistor 230, and the organic light-emitting diode 260 described previously with respect to FIG. 1 and, therefore, their detailed description will not be repeated hereinafter.

The first buffer layer 310 of the light-emitting display device 30 may be formed on the substrate 300. The first buffer layer 310 may be made of silicon oxide ($SiO_2$) to a thickness of from about 700 angstroms to about 900 angstroms. The second buffer layer 320 may be made by depositing silicon nitride (SiNx) on the first buffer layer 310 to a thickness of from about 100 angstroms to about 300 angstroms. Without intending to be bound by theory, it is believed the control of the thickness of the first buffer layer 310 and the second buffer layer 320 may facilitate control of the red light emitted from the organic light-emitting diode 360 and absorbed by the photo sensor 340, thereby achieving a quantum efficiency rate of from about 50% to about 90%. Similarly to the first and second buffer layers 210 and 220, the first buffer layer 310 and the second buffer layer 320 may minimize diffusion of impurities into the thin film transistor 330 and the photo sensor 340 during post-processing.

The photo sensor 340 of the light-emitting display device 30 according to an embodiment of the present invention may be similar to the photo sensor 240 described previously with respect to FIG. 1 with the exception that the intrinsic region 342 of the photo sensor 340 may have a width of from about 4 μm to about 10 μm. Similarly to the embodiment described previously with respect to FIGS. 1-2, such a width of the intrinsic region 342 may provide the photo sensor 340 with a quantum efficiency of from about 50% to about 90%, when it is formed on buffer layers having specific thicknesses as described above.

Figure 4:
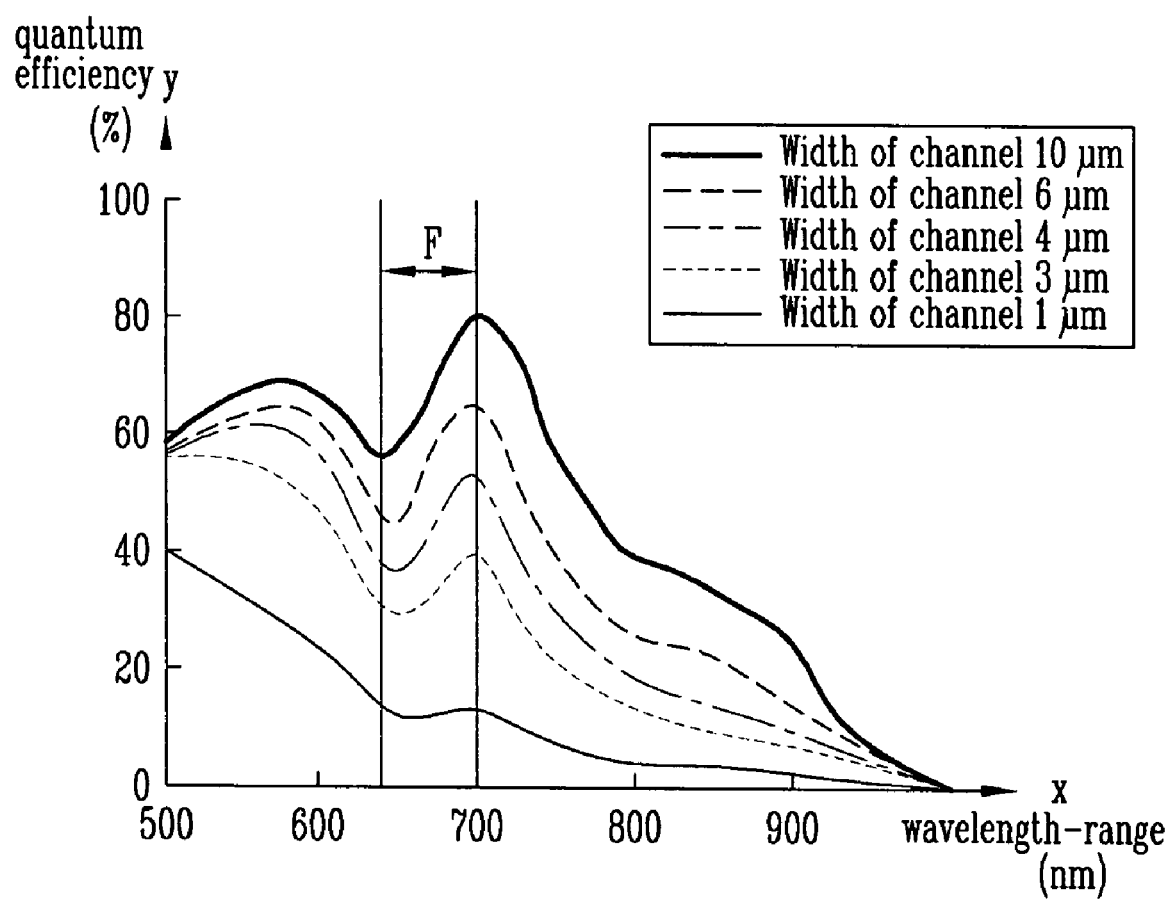
FIG. 4 illustrates a graph of quantum efficiency of the photo sensor illustrated in FIG. 3.

For example, as illustrated in FIG. 4, a photo sensor formed on two buffer layers, i.e., a first buffer layer having a thickness of 800 angstroms and a second buffer layer having a thickness of 200 angstroms, and having an intrinsic layer with a width of 4 μm, exhibits quantum efficiency of about 50%. Further, an increase in the width of the intrinsic region to 10 μm may provide quantum efficiency of about 60% to about 80%. On the other hand, when the intrinsic region had a width below 4 μm, the quantum efficiency of the photo sensor is in the range of 10% to 40%.

Figure 5:
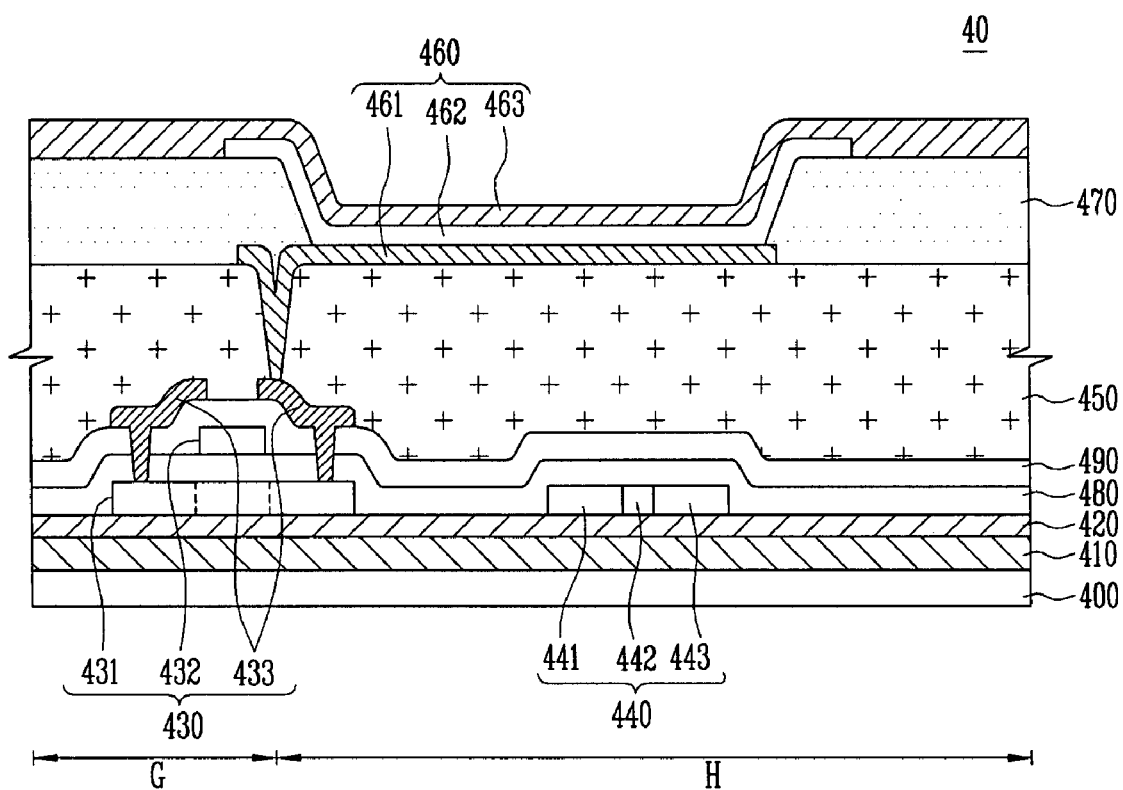
FIG. 5 illustrates a cross-sectional view of an organic light-emitting display device having a photo sensor according to another exemplary embodiment of the present invention.

In yet another exemplary embodiment of the present invention, illustrated in FIG. 5, an organic light-emitting display device 40 may include a substrate 400 having a non-pixel region H and a pixel region G, a first buffer layer 410 and a second buffer layer 420 on the substrate 400, a thin film transistor 430 on the second buffer layer 420, an organic light-emitting diode 460 electrically connected to the thin film transistor 430, and a photo sensor 440. The structures of the substrate 400, the thin film transistor 430, and the organic light-emitting diode 460 may be similar to the structures of the substrate 200, the thin film transistor 230, and the organic light-emitting diode 260 described previously with respect to FIG. 1, and therefore, their detailed description will not be repeated hereinafter.

The first and second buffer layers 410 and 420 of the light-emitting display device 40 may be similar to the first and second buffer layers 210 and 220 described previously with respect to FIG. 1 with the exception that a thickness of the first buffer layer 410 may be from about 700 angstroms to about 900 angstroms, and a thickness of the second buffer layer 420 may be from about 300 angstroms to about 500 angstroms.

The photo sensor 440 of the light-emitting display device 40 according to an embodiment of the present invention may be similar to the photo sensor 240 described previously with respect to FIG. 1 with the exception that the intrinsic region 442 of the photo sensor 440 may have a width of from about 5 μm to about 10 μm. Similarly to the embodiment described previously with respect to FIGS. 1-2, such a width of the intrinsic region 442 may provide the photo sensor 440 with a quantum efficiency of from about 50% to about 90%, when it is formed on buffer layers having specific thicknesses as described above.

Figure 6:
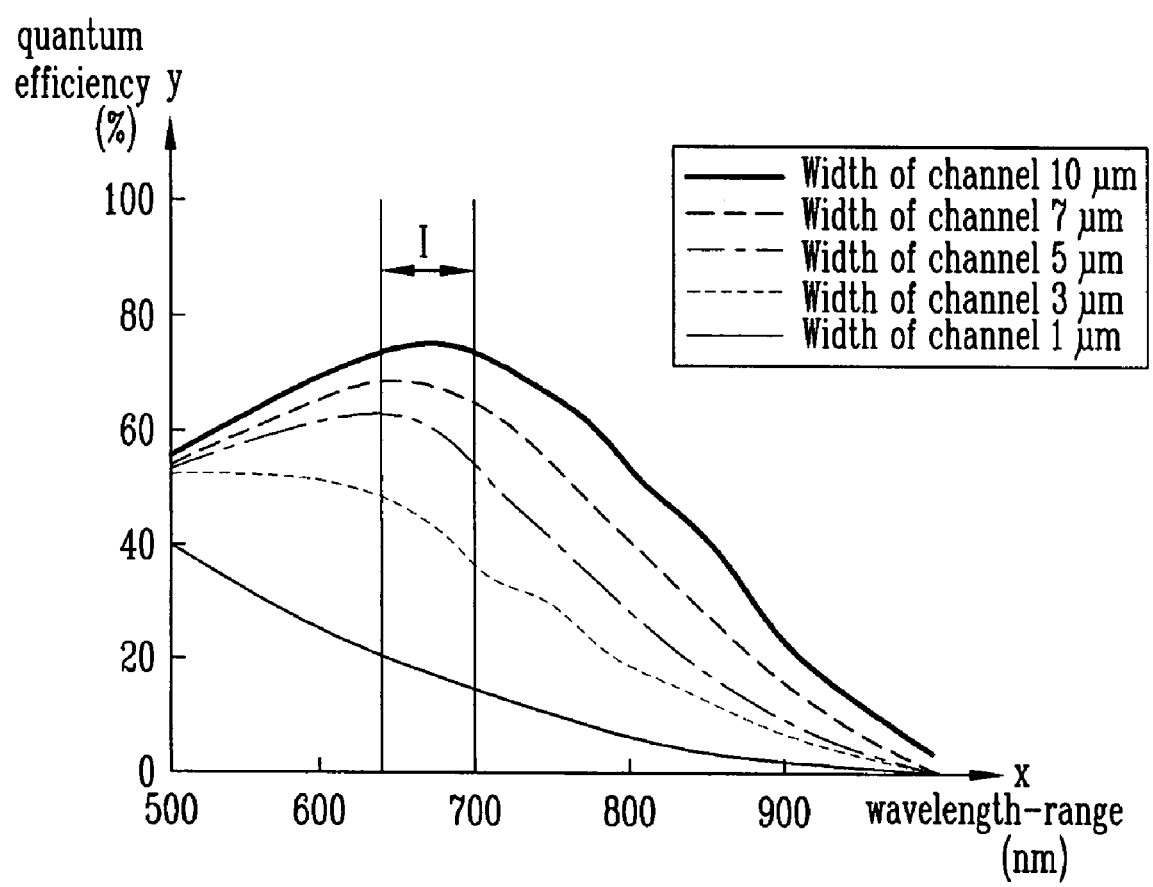
FIG. 6 illustrates a graph of quantum efficiency of the photo sensor illustrated in FIG. 5.

For example, as illustrated in FIG. 6, a photo sensor formed on two buffer layers, i.e., a first buffer layer having a thickness of 800 angstroms and a second buffer layer having a thickness of 400 angstroms, and having an intrinsic layer with a width of 5 μm, exhibits quantum efficiency of almost 60%. Further, an increase in the width of the intrinsic region to 10 μm may provide quantum efficiency of almost 80%. On the other hand, when the intrinsic region had a width below 4 μm, the quantum efficiency of the photo sensor is in the range of 15% to 40%.

Figure 7:
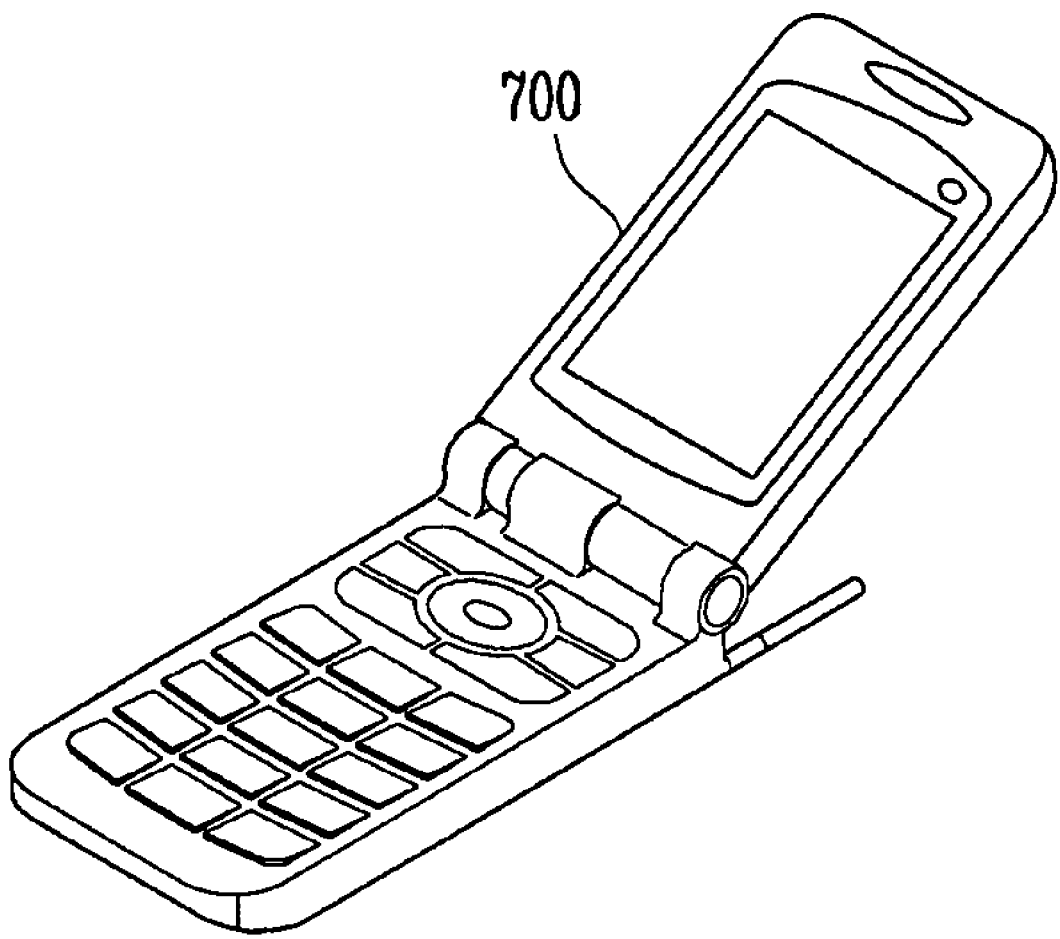
FIG. 7 and FIG. 8 illustrate views of exemplary portable electronic devices having an organic light-emitting display device according to an embodiment of the present invention.
Figure 8:
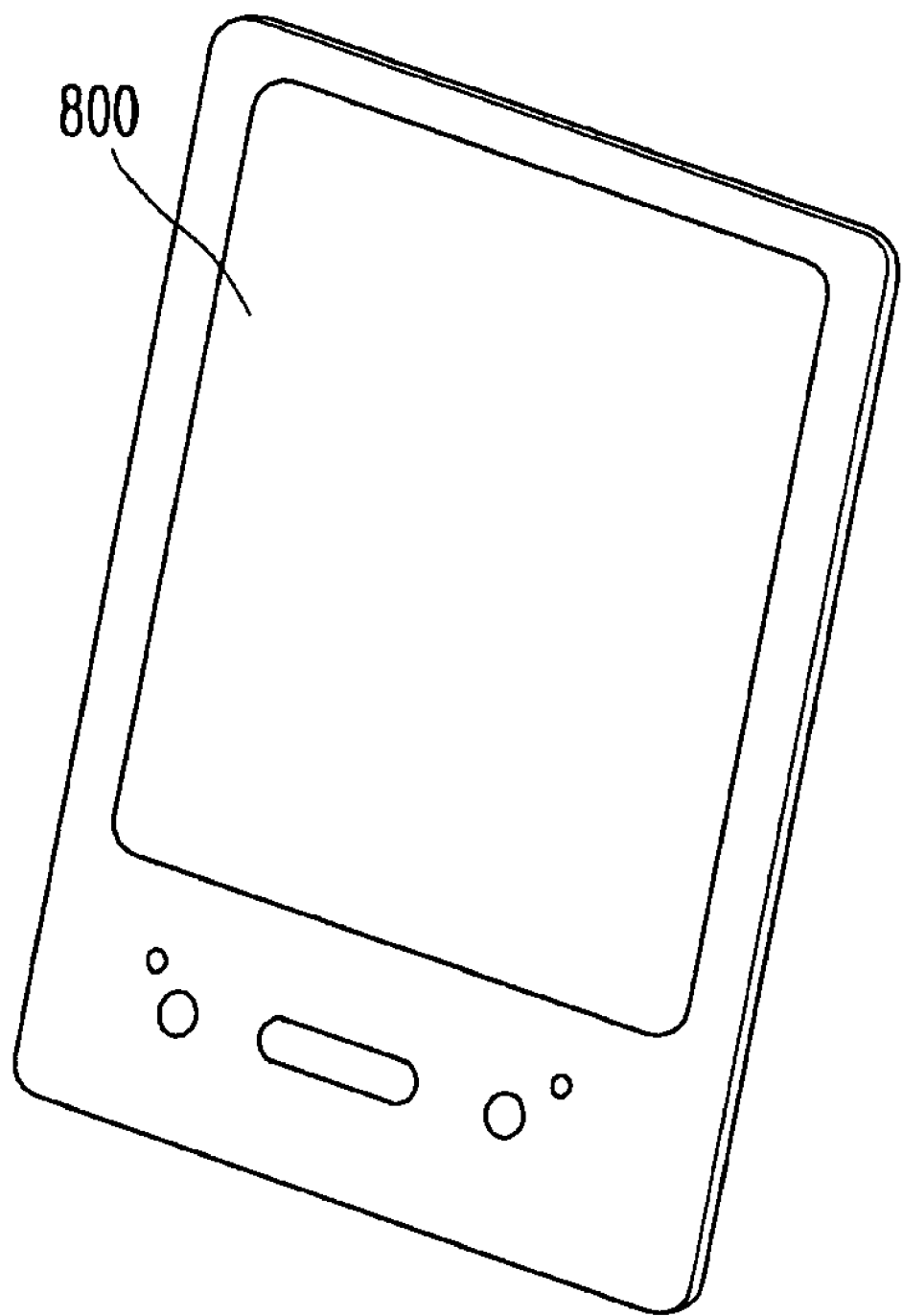

As illustrated in FIGS. 7-8, the organic light-emitting display device according to embodiments previously described with respect to FIGS. 1-6 may be employed in any portable electronic apparatus, e.g., a cellular phone, a lap-top type computer, a digital camera, a personal multimedia player (PMP), and so forth.

As described above, the present invention is advantageous in providing an organic light-emitting display device having a photo sensor capable of absorbing light in the red wavelength range at an enhanced quantum efficiency of from about 50% to about 95% and controlling the brightness of the organic light-emitting display device accordingly. Such enhanced quantum efficiency may be achieved by controlling the thickness of the buffer layers formed between the photo sensor and the substrate and the width of the intrinsic region of the photo sensor. As such, the present invention may advantageously minimize brightness and image quality wear due to organic layer deterioration, thereby enhancing current flow into pixels and improving overall quality of the organic light-emitting display.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting display device, comprising:
   a substrate;
   a first buffer layer and a second buffer layer on the substrate;
   a thin film transistor on the second buffer layer;
   an organic light-emitting diode electrically connected with the thin film transistor; and a horizontal photo sensor with an intrinsic region between a N-type doping region and a P-type doping region on the second buffer layer, bottom surfaces of the intrinsic region, the N-type doping region, and the P-type doping region being coplanar, and the photo sensor being configured to absorb red light from the organic light-emitting diode and of exhibiting to exhibit quantum efficiency of from about 50% to about 90% in the entire wavelength range of from about 645 nm to about 700 nm.

2. The organic light-emitting display device as claimed in claim 1, wherein the first buffer layer has a thickness of from about 2900 angstroms to about 3100 angstroms, the second buffer layer has a thickness of from about 200 angstroms to about 400 angstroms, and the intrinsic region has a width of from about 3 μm to about 10 μm.

3. The organic light-emitting display device as claimed in claim 2, wherein the first buffer layer has a thickness of about 3000 angstroms and the second buffer layer has a thickness of about 300 angstroms.

4. The organic light-emitting display device as claimed in claim 1, wherein the first buffer layer has a thickness of from about 700 angstroms to about 900 angstroms, the second buffer layer has a thickness of from about 100 angstroms to about 300 angstroms, and the intrinsic region has a width of from about 4 μm to about 10 μm.

5. The organic light-emitting display device as claimed in claim 4, wherein the first buffer layer has a thickness of about 800 angstroms and the second buffer layer has a thickness of about 200 angstroms.

6. The organic light-emitting display device as claimed in claim 1, wherein the first buffer layer has a thickness of from about 700 angstroms to about 900 angstroms, the second buffer layer has a thickness of from about 300 angstroms to about 500 angstroms, and the intrinsic region has a width of from about 5 μm to about 10 μm.

7. The organic light-emitting display device as claimed in claim 6, wherein the first buffer layer has a thickness of about 800 angstroms and the second buffer layer has a thickness of about 400 angstroms.

8. The organic light-emitting display device as claimed in claim 1, wherein a gate insulating layer is disposed on the second buffer layer, a portion of the gate insulating layer being positioned between the thin film transistor and the photo sensor.

9. The organic light-emitting display device as claimed in claim 1, wherein the first buffer layer includes silicon oxide.

10. The organic light-emitting display device as claimed in claim 1, wherein the second buffer layer includes silicon nitride.

11. The organic light-emitting display device as claimed in claim 1, wherein the bottom surface of each of the intrinsic region, the N-type doping region, and the P-type doping region is directly on the second buffer layer.

12. The organic light-emitting display device as claimed in claim 1, wherein the photo sensor is configured to convert the absorbed red light into electrical signals.

13. The organic light-emitting display device as claimed in claim 12, wherein the electrical signals are configured to control brightness of the light emitted from the organic light-emitting diode.

14. The organic light-emitting display device as claimed in claim 1, wherein the photo sensor includes amorphous silicon.

15. The organic light-emitting display device as claimed in claim 1, wherein the organic light-emitting diode includes a transparent anode.

16. The organic light-emitting display device as claimed in claim 1, wherein the organic light-emitting diode is a rear-type organic light-emitting diode.

17. A portable electronic apparatus, comprising an organic light-emitting display device having a substrate, two buffer layers on the substrate, a thin film transistor, an organic light-emitting diode electrically connected with the thin film transistor, and a horizontal photo sensor having an intrinsic region, a N-type doping region, and a P-type doping region with coplanar bottom surfaces, wherein the photo sensor is configured to absorb red light from the organic light-emitting diode and to exhibit quantum efficiency of from about 50% to about 90% in the entire wavelength range of from about 645 nm to about 700 nm.

18. The organic light-emitting display device as claimed in claim 1, wherein the intrinsic region has a width from about 5 μm to about 10 μm.

* * * * *